United States Patent
Mazumder (10) Patent No.: US 11,657,866 B2
(45) Date of Patent: May 23, 2023

(54) QED SHIFTER FOR A MEMORY DEVICE

(71) Applicant: Micron Technology, Inc., Boise, ID (US)

(72) Inventor: Kallol Mazumder, Dallas, TX (US)

(73) Assignee: Micron Technology, Inc., Boise, ID (US)

(*) Notice: Subject to any disclaimer, the term of this patent is extended or adjusted under 35 U.S.C. 154(b) by 76 days.

(21) Appl. No.: 17/459,722

(22) Filed: Aug. 27, 2021

(65) Prior Publication Data

US 2023/0065930 A1    Mar. 2, 2023

(51) Int. Cl.
| | | |
|---|---|---|
| G11C 7/22 | (2006.01) | |
| G11C 11/4076 | (2006.01) | |
| G06F 1/3234 | (2019.01) | |
| H03L 7/081 | (2006.01) | |
| G11C 11/4096 | (2006.01) | |
| G11C 11/4093 | (2006.01) | |
| G06F 1/3296 | (2019.01) | |

(52) U.S. Cl.
CPC ........ *G11C 11/4076* (2013.01); *G06F 1/3275* (2013.01); *G06F 1/3296* (2013.01); *G11C 11/4093* (2013.01); *G11C 11/4096* (2013.01); *H03L 7/0814* (2013.01); *G11C 7/222* (2013.01)

(58) Field of Classification Search
CPC ............ G11C 11/4076; G11C 11/4093; G11C 11/4096; G11C 7/222; G06F 1/3275; G06F 1/3296; H03L 7/0814
See application file for complete search history.

(56) References Cited

U.S. PATENT DOCUMENTS

| | | | |
|---|---|---|---|
| 9,536,591 B1* | 1/2017 | Kwak | G11C 5/025 |
| 11,574,661 B1* | 2/2023 | Mazumder | G11C 7/1012 |
| 2018/0053538 A1* | 2/2018 | Miyano | G11C 7/1057 |
| 2019/0121577 A1* | 4/2019 | Mazumder | G11C 29/023 |
| 2019/0244644 A1* | 8/2019 | Komatsu | G11C 8/10 |
| 2019/0259442 A1* | 8/2019 | Chen | H04L 25/03267 |
| 2020/0135257 A1* | 4/2020 | Miyano | H03L 7/0814 |
| 2022/0383930 A1* | 12/2022 | Gajapathy | G06F 1/3287 |

FOREIGN PATENT DOCUMENTS

CN    114078503 B  *  5/2022  ............. G06F 1/08

* cited by examiner

*Primary Examiner* — Mushfique Siddique
(74) *Attorney, Agent, or Firm* — Fletcher Yoder, P.C.

(57) ABSTRACT

A memory device includes a command interface configured to receive a command from a host device. The memory device also includes a command shifter configured to receive the command. The command shifter includes a plurality of stages coupled in series and configured to delay the command. The command shifter comprises selection circuitry configured to receive the command and to select an insertion stage of the plurality of stages for the command. The selection circuitry is configured to select the insertion stage as a location to insert the command. The selected insertion stage is selected to control a duration of delay in the command shifter. The selection of the insertion stage is based at least in part on a path delay between a clock and a data pin of the memory device.

24 Claims, 4 Drawing Sheets

QED SHIFTER FOR A MEMORY DEVICE

BACKGROUND

Field of the Present Disclosure

Embodiments of the present disclosure relate generally to the field of semiconductor devices. More specifically, embodiments of the present disclosure relate to a QED shifter topology for a memory device.

Description of Related Art

Semiconductor devices (e.g., memory devices) utilize timings with shifts of data signals, data strobes, commands, and/or other signals to perform operations. A DQ Enable Delay (QED) shifter includes multiple stages (e.g., flip-flops) that shift commands with output elements (e.g., reads or on-die terminations (RTTs)) through the QED shifter to match to a latency for the memory device. The duration of the shifting may be set according to a latency (e.g., column address strobe (CAS) latency (CL)) that may be calculated using delay locked loop (DLL) circuitry in the memory device. This latency may be recalculated after a clock frequency or cycle duration (tck) of the clock changes. The duration in the QED shifter may also be set using other factors, such as the duration of path delay from the input pins of the memory device to the input of the QED shifter and/or data strobe (DQS). Since path delay and/or CL may vary based on frequency/tck, as the frequency range increases for the memory device the range of the different possible durations in the QED shifter change. Furthermore, as the frequency range of the memory device grows, the circuits used to adjust the QED durations based on CL and/or path delay may be relatively large and/or may grow rapidly as the range of possible frequencies for the memory device grows.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A DQ Enable Delay (QED) shifter may be a plurality of stages/shifters/flip-flops that shift a command through the QED shifter. A location for exiting a QED shifter may be based on a path delay between a clock and a data (DQ) pin of the memory device. As ranges of durations through a QED shifter of a memory device grow, the complexity of a multiplexer used to select when to exit the QED shifter becomes more costly, space-consuming, and delay-increasing. To avoid this delay at the time critical end of the QED shifter, selection circuitry for injecting a command into a memory device may adjusted to compensate for the path delay rather than at the end of the QED shifter. Accordingly, the command may be injected into the QED shifter at a location based on a set column address strobe (CAS) latency minus the path delay. This shifts the delays for selection (e.g., via a demultiplexer) to a less time-critical portion of the memory device.

Furthermore, the memory device may operate in a half-frequency mode at half the frequency of a clock from the host device. This half-frequency clock which is internal to the memory device may not impact an overall operating frequency. For example, to accommodate this lower speed, the memory device may include two pipelines in the QED shifter, one for even clock assertions and one for odd clock assertions. Thus, the command shifts through a respective pipeline at every other clock cycle. However, some commands may require a shift and/or a stretch of a single clock cycle. To address these situations, the QED shifter may shift these commands from the even pipeline to the odd pipeline or vice versa. Furthermore, since the shifting of these commands between pipelines may impact later stages, either the swapping of pipelines would need to be swapped back in the pipelines or the swapping may be performed at the ends of the pipelines.

Figure 1:
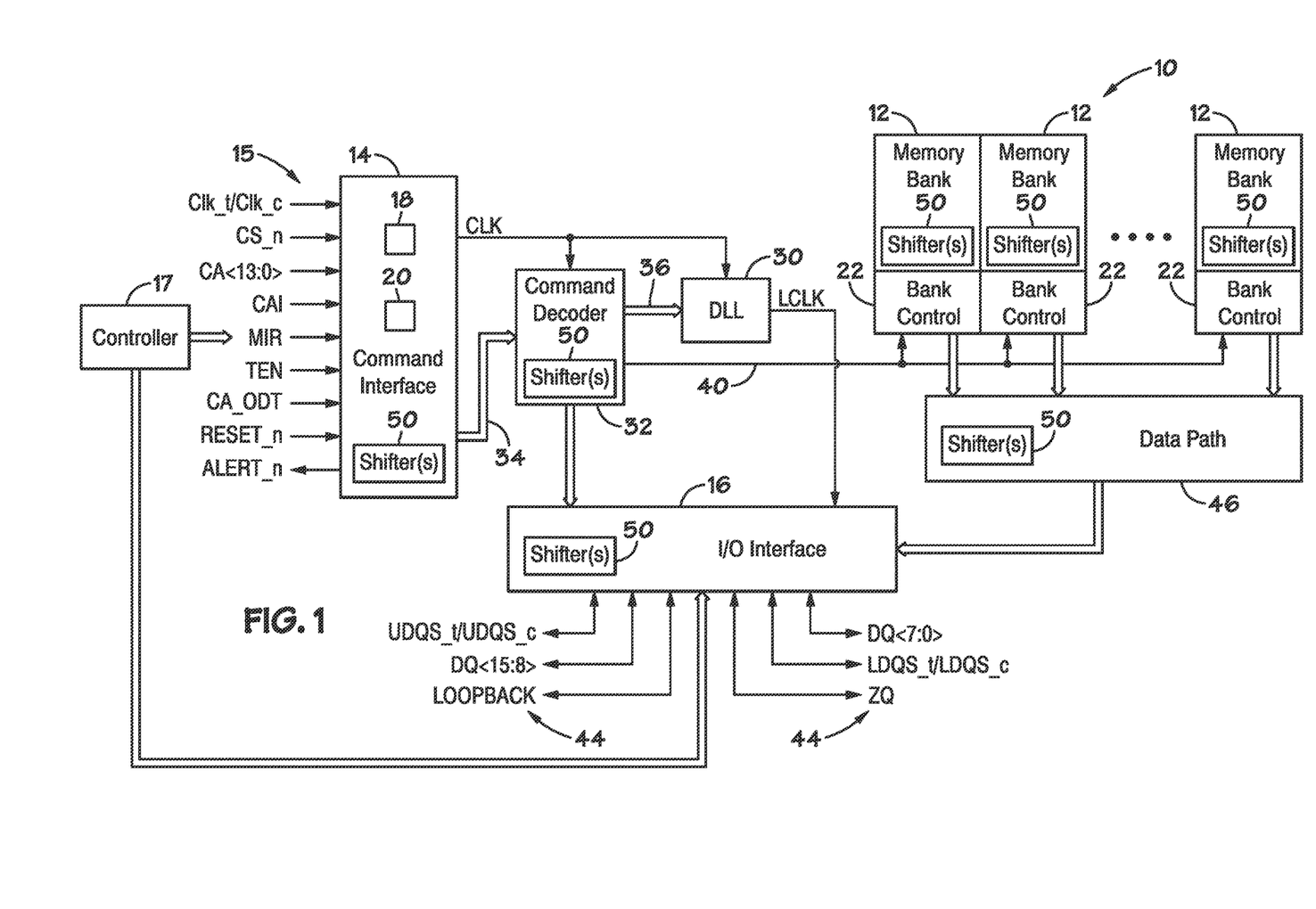
FIG. 1 is a simplified block diagram illustrating certain features of a memory device having QED shifter circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external host device, such as a controller 17 that may be embodied as a processor and/or other host device. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complimentary or bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) 30. The DLL 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. Additionally or alternatively, the command decoder may send internal write signals 41 to the IO interface 16. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving signals 44 (e.g., data and/or strobes to capture the data) through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the TO signals may be divided into upper and lower bytes. For instance, for a ×16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS. The DQS is driven by the external processor or controller sending the data (e.g., for a write command) or by the memory device 10 (e.g., for a read command). For read commands, the DQS is effectively additional data output (DQ) signals with a predetermined pattern. For write commands, the DQS is used as clock signals to capture the corresponding input data. As with the clock signals (Clk_t and Clk_c), the DQS may be provided as a differential pair of data strobe signals (DQS_t and DQS_c) to provide differential pair signaling during reads and writes. For certain memory devices, such as a DDR5 SDRAM memory device, the differential pairs of DQS may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the TO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

The I/O interface 16, the command decoder 32, and/or data path 46 may include shifter circuitry 50 that is used to shift commands in the memory device 10. Additionally or alternatively, shifter circuitry 50 may be included in any other locations in the memory device 10. For example, shifter circuitry 50 may be included in the memory banks 12, the command interface 14, and/or any other suitable locations. The shifter circuitry 50 may include multiple stages (e.g., flip-flops) that are used to shift through commands. For example, the shifter circuitry 50 may include a QED shifter that is a command shifter includes the multiple stages to shift commands that have an output component (e.g., read and/or on-die termination (RTT) commands) for a specified latency for the memory device 10. For instance, the specified latency may be the column address strobe (CAS) latency (CL). The CL may be specified for the memory device 10 from the external host device/controller 17 via a mode register. As discussed below, the memory device 10 may vary from the specified amount by various factors to compensate for deviations, such as a data path delay from the input pins of the memory device 10 to the QED shifter of the shifter circuitry 50.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
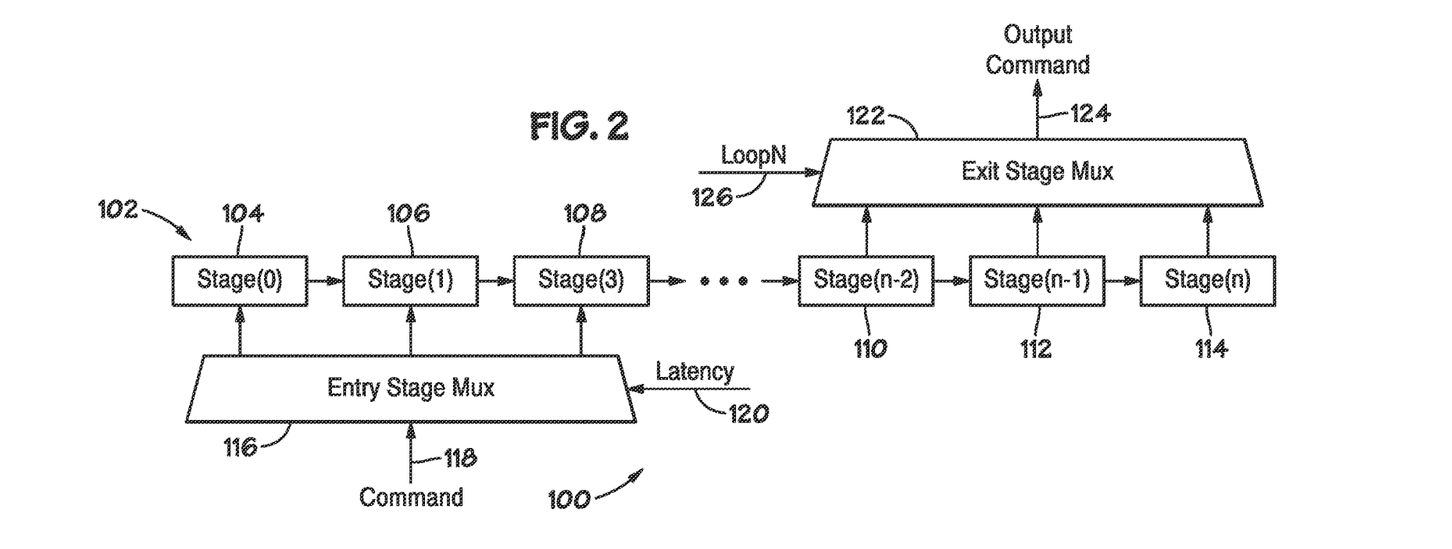
FIG. 2 is a circuit diagram of a QED shifter of the QED shifter circuitry of FIG. 1 where the QED shifter includes an input demultiplexer and an output multiplexer, in accordance with an embodiment.

FIG. 2 is a circuit diagram of a QED shifter 100 that may be included in the shifter circuitry 50 in any suitable location in the embodiment of the memory device in FIG. 1. As illustrated, the QED shifter 100 includes a string 102 of shifters 104, 106, 108, 110, 112, and 114, collectively referred to as shifters or "stages" 104-114. The shifters 104-114 may include a string of flip-flops that are sequentially tied together with an input of a subsequent flip-flop being tied to an output of the previous flip-flop. Furthermore, the shifters 104-114 may utilize a common clock. The string 102 of shifters 104-114 includes six shifters, but the length of the string 102 may include the number of flip-flops length being equal to a maximum number of clocks for CL for the memory device 10. In some embodiments, the string 102 may include some additional flip-flops for additional buffering and/or for future use in the memory device 10. Entry selection circuitry 116 (e.g., an entry stage demultiplexer) may be used to select where to insert a command 118 into the string 102 of shifters 104-114. For example, the entry selection circuitry 116 may transmit/inject the command 118 to a left-most stage (i.e., input of shifter 104) when a maximum CL is selected for the memory device 10, and the entry selection circuitry 116 may transmit/inject the command 118 to a right-most stage (i.e., input of shifter 108) when a minimum CL is selected for the memory device 10. Likewise, the entry selection circuitry 116 may utilize any intermediate CL durations to transmit/inject the command 118 to any stages in between the left-most and right-most stages. In other words, as latency increases, the entry stage shifts more leftward. Accordingly, the entry selection circuitry 116 may receive a signal indicating latency 120 that indicates a duration for the CL. For instance, this latency 120 may be received from the external host device/controller 17.

Although the entry selection circuitry 116 may inject a command into the QED shifter 100 to delay the command 118 by a number (e.g., 50) clock cycles equal to the entire CL, there may be some path delay between the clk and the DQ pin of the memory device 10. The amount of cycles delayed in the path delay is frequency dependent and process corner dependent. Higher frequencies generally lead to more cycles of path delay. To compensate for this path delay and output an output command 124 that is aligned to the clock, the QED shifter 100 may utilize an exit selection circuitry 122 based on the amount of path delay. The DLL 30 (FIG. 1) measures and matches delay based on this path delay. The DLL 30 calculates this path delay as a value referred to as LOOPN 126 indicative of the path delay for the current frequency. Whenever a frequency/tck is changed for the memory device 10, the DLL 30 may recalculate LOOPN 126. As the LOOPN 126 increases, the exit selection circuitry 122 may select an earlier stage in the QED shifter 100. Furthermore, the exit selection circuitry 122 is in the time-critical path for the command 118. Additionally, the LOOPN 126 is a DC signal determined by the DLL 30 that is available long before the command 118 has reached the end of the string 102 of shifters 102-114. As frequency ranges increase, the range for LOOPN 126 increases. Therefore, as more frequencies become available, the size of the exit selection circuitry 122 increases. However, the combination logic in the exit selection circuitry 122 also grows in physical size and costs thereby potentially rendering the exit selection circuitry 122 impractically large or expensive for the memory device 10. Additionally, the exit selection circuitry 122 for large ranges may have a deep combinational logic that may slow down the command 118 since the exit selection circuitry 122 is in the speed path.

Figure 3:
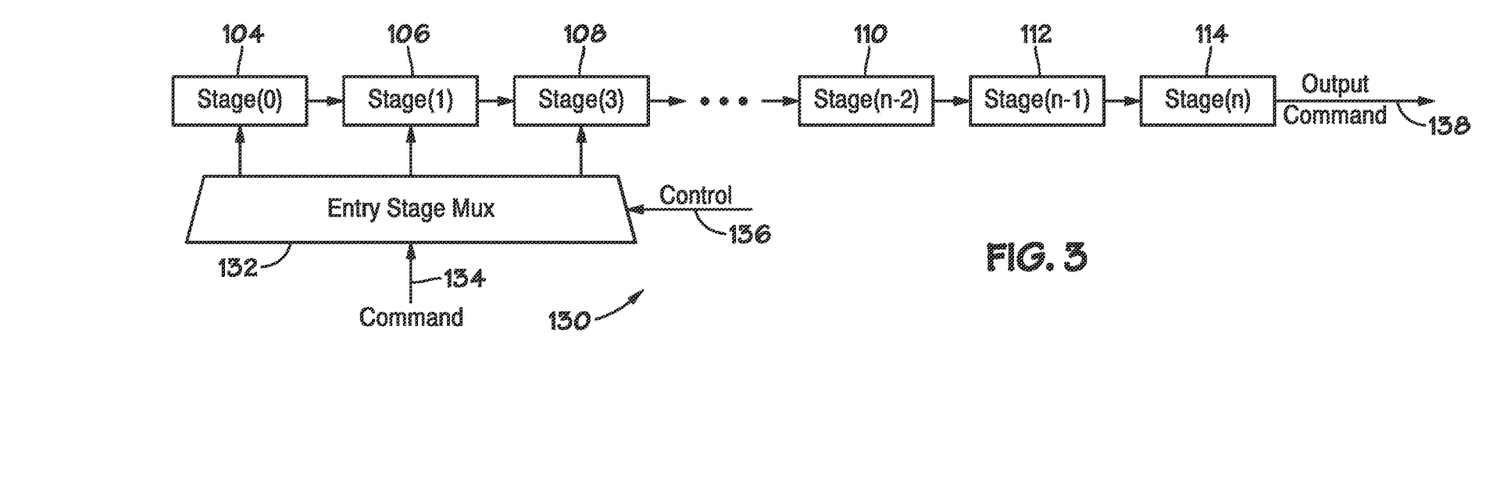
FIG. 3 is a circuit diagram of a QED shifter of the QED shifter circuitry of FIG. 1 where the QED shifter includes an input demultiplexer and the command exits the last stage, in accordance with an embodiment.

To address the issues of speed, size, and cost with the exit selection circuitry 122, the exit selection circuitry 122 may be omitted. FIG. 3 shows a circuit diagram of a QED shifter 130 that may be present in any of the shifter circuitries 50 of FIG. 1. As illustrated, the QED shifter 130 does not include the exit selection circuitry 122. Instead, the QED shifter 130 includes a selection circuitry 132 that receives the command 134. The entry selection circuitry 132 functions similar to the entry selection circuitry 116 of FIG. 2 except that the entry selection circuitry 132 selects an entry stage based on a control signal 136 instead of directly using the latency 120. The control signal 136 is based at least in part on the LOOPN 126 subtracted from the latency 120. In some embodiments, the control signal 136 may be a function of other signals. For example, the control signal 136 may be the value of the latency 120 minus the value of the LOOPN 126 and additional values. For instance, the additional values may include a walkback value, a maximum preamble length, a maximum DQS offset, a data rate output shift, and/or other parameters. The walkback value indicates a number of cycles used to walkback to a faster clock. The number of cycles for walkback depends upon frequency that may be set using a mode register that specifies the frequency for the memory device 10. The preamble maximum and the maximum DQS offset may be fixed according to specification for the memory device 10. The data rate output shift may indicate a number of fixed cycles at output depending on a type of mode for the memory device 10. For instance, for full-frequency operation, the data rate output cycles may be a first number (e.g., 2) of cycles while the data rate output cycles may be a second number (e.g., 4) of cycles for half-frequency operation. In other words, the LOOPN 126 and the walkback may be dependent on operating frequency while the other parameters may be fixed but vary between different implementations of the memory device 10.

By removing the exit selection circuitry 122, the output command 138 may be output from the string 102 of shifters 104-114 through a speed path that is no longer impacted by a multiplexer where the selectors (e.g., LOOPN 126) are static. Instead, in the QED shifter 130, the speed path is a pure clocked path.

Figure 4:
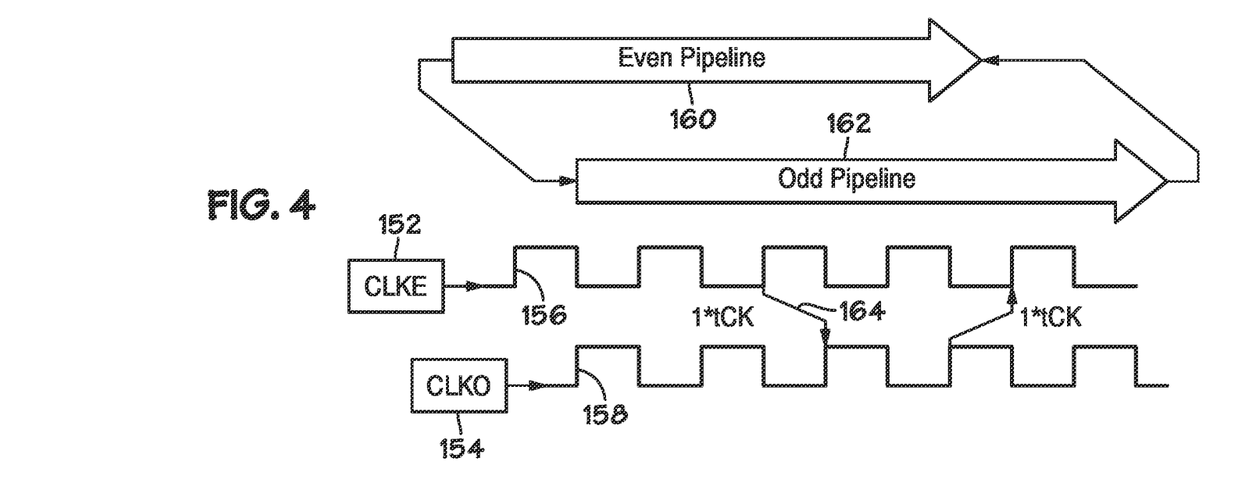
FIG. 4 is a timing diagram of a half-frequency mode for a memory device that includes an even clock that drives an even pipeline and that has pulses corresponding to even pulses of a system clock of the memory device and an odd clock that drives an odd pipeline and that has pulses corresponding to odd pulses of the system clock, in accordance with an embodiment.

As previously noted, the memory device 10 may utilize half-frequency operation where one or more shifters and/or other circuitries are divided into two separate pipelines that operate at half of the clock frequency. For instance, FIG. 4 shows a timing diagram of half-frequency operation. As illustrated, an even clock (CLKE) 152 and an odd clock (CLKO) 154 may be generated from the CLK each at half the frequency of the CLK. The CLKE 152 and the CLKO 154 are 180 degrees out of phase with each other. Specifically, the CLKE 152 has an assertion 156 corresponding to an assertion of the CLK while the CLKO 154 has an assertion 158 of a next assertion of the CLK. The CLKE 152 is used to drive an even pipeline 160 including a first set of shifters and/or other circuitry, and the CLKO 154 is used to drive an odd pipeline 162 including a second set of shifters and/or other circuitry. Although CL and burst length (BL) may correspond to an even number of shifts causing shifts to remain in a corresponding pipeline, certain mode register settings may result in an odd number of shifts causing the command to be shifted between the even pipeline 160 and the odd pipeline 162. For example, these mode register settings may include shifting on-die termination (RTT) rise/fall edges independently in steps of 1 tCK. Such a shift of an odd number of tCKs (e.g., 1 tCK shift 164) would result in an odd latency, burst-length, or both. To be able to address these shifts by an odd number of tCKs, the QED shifters may utilize a mechanism where commands are transitioned from the even pipeline 160 to the odd pipeline 162 or vice versa.

Figure 5:
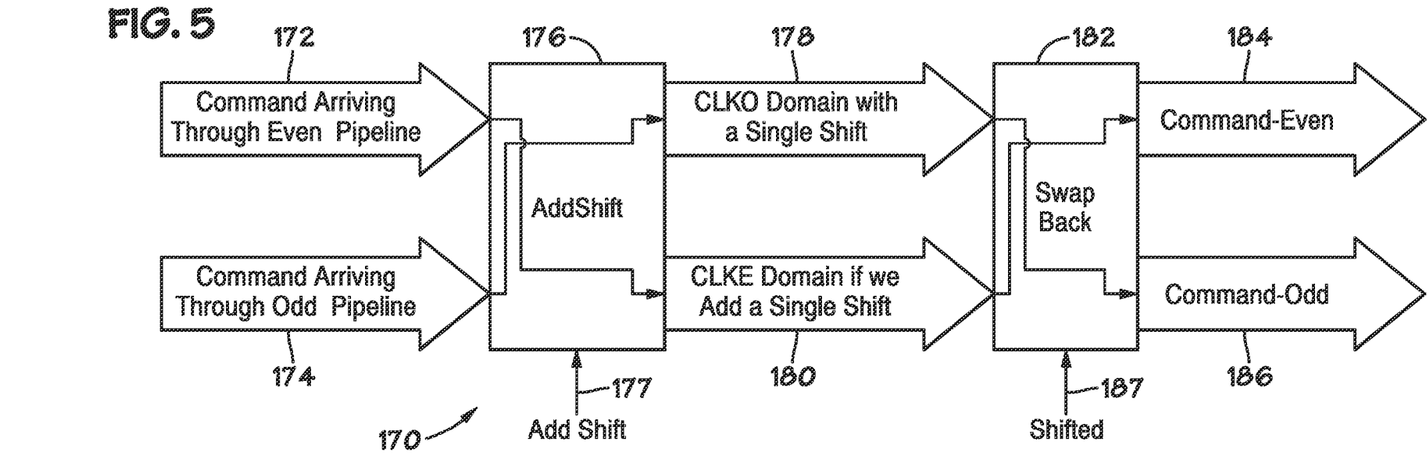
FIG. 5 is a flow diagram of flow for driving commands through the even and odd pipelines of FIG. 4 with single shifts added to the command(s), in accordance with an embodiment.

FIG. 5 shows a flow diagram of circuitry 170 that may be utilized in the QED shifters to swap pipelines when shifting an odd number (e.g., 1) of tCKs. As illustrated, the circuitry 170 includes an even pipeline 172 and an odd pipeline 174 where commands arrive at shift circuitry 176 through the even pipeline 172 and/or the odd pipeline 174. The even pipeline 172 may be equivalent to the even pipeline 160, and the odd pipeline 174 may be equivalent to the odd pipeline 162. When a command from either pipeline arrives at the shift circuitry 176, the shift circuitry 176 may shift the command. For example, the command may be shifted using a flip-flop to shift the command by a single cycle. The shift circuitry 176 may utilize selection circuitry (e.g., a multiplexer and/or other combination logic) to select whether the shifted version or the unshifted version of the command is output. This selection may be based on an addshift signal 177 that indicates whether the command is to be shifted.

For example, when the decoded command corresponds to a 1 tCK shift, the addshift signal 177 may be asserted. A copy of the shifting and selection circuitry may be in the shift circuitry 176 and used for the even pipeline 172, and a second copy of the shifting and selection circuitry may be included in the shift circuitry 176 and used for the odd pipeline 174. Furthermore, since a single shift may correspond to a switch of the command from one pipeline lltwoll to the other, the selection circuitry for each pipeline may choose between an unshifted version of its own command or a shifted version of the command from the other pipeline. For instance, when a shift occurs, an output command 180 is the command received in the even pipeline 172 before the shift, and/or an output command 178 is the command received in the odd pipeline 174 before the shift. Thus, the commands are shifted and the pipelines are shifted. However, for later stages these commands are shifted back using swap-back circuitry 182. The swap-back circuitry 182 may use first selection circuitry to determine whether to output an even command 184 from the even pipeline 172 or the odd pipeline 174. Similarly, the swap-back circuitry may use second selection circuitry to determine whether to output an odd command 186 from the even pipeline 172 or the odd pipeline 174. The selection may be based on a shifted signal 187 indicating whether the commands have been shifted and/or swapped between pipelines. For instance, the shifted signal 187 may be a delayed version of the addshift signal 177.

The shift circuitry 176 that handles shifts of odd numbers of cycles may also be used to handle stretches of a command by 1 tCK. To stretch the command, the shift circuitry 176 may shift the command and OR the shifted command with the unshifted command to stretch the command.

Figure 6:
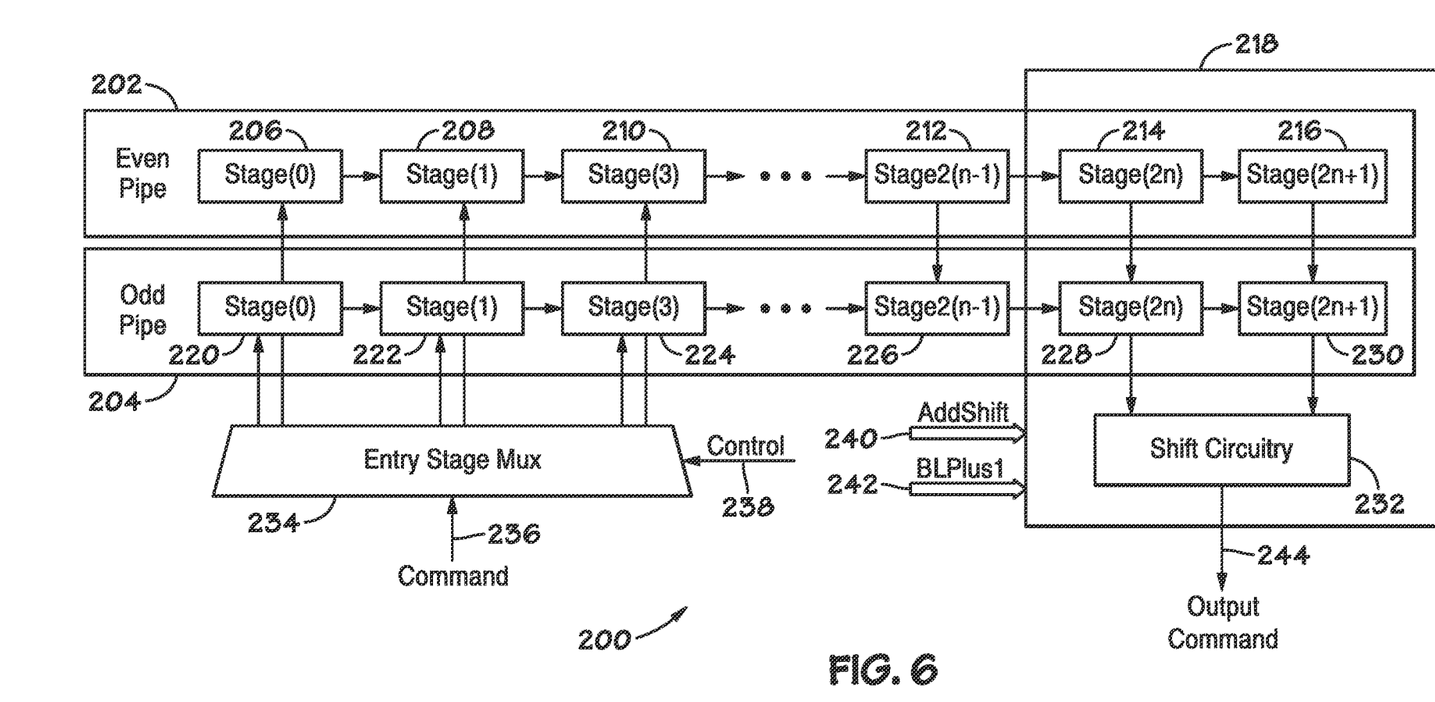
FIG. 6 is a circuit diagram of a QED shifter of the QED shifter circuitry of FIG. 1 where the QED shifter may implement a half-frequency mode for the memory device, in accordance with an embodiment.

The shift circuitry 176 may be located at the end of the QED shifter. For example, FIG. 6 shows a QED shifter 200 that may be utilized in the memory device 10 using half-frequency operation. The QED shifter 200 includes an even pipeline 202 and an odd pipeline 204. The even pipeline 202 includes shifters 206, 208, 210, 212, 214, and 216, collectively referred to as shifters or stages 206-216. The odd pipeline 204 includes shifters 220, 222, 224, 226, 228, and 230, collectively referred to as shifters or stages 220-230. Shift circuitry 232 may pull from any of the shifters 214, 216, 228, and 230, in a switch area 218 at the end of the even pipeline 202 and the odd pipeline 204.

The QED shifter 200 also includes entry selection circuitry 234 like the previously discussed entry selection circuitry 132. The entry selection circuitry 234 utilizes the control signal 238 to control an entry point for a command 236. The control signal 238 may be calculated similarly to how the control signal 136 is calculated.

Shift circuitry 232, similar to the shift circuitry 176, may receive the command(s) from the switch area 218 that includes the 2*n* stage and the 2*n*+1 stage of each pipeline. However, unlike the shift circuitry 176, the command may be received as shifted from the 2*n* and 2*n*+1 stages rather than shifting (e.g., using an additional flip-flop) in the shift circuitry 232. In other words, the shift circuitry 232 receives a shifted (e.g., stage 2*n*+1 output) and an unshifted (e.g., stage 2*n*) command from each pipeline. The shift circuitry 232, as discussed above in relation to the shift circuitry 176, selects the 2*n*+1 stage (shifted command) of the other pipeline (e.g., even pipeline) when the command in the respective pipeline has a 1 tCK shift or a stretch. Otherwise, the shift circuitry 232 outputs the respective command from the respective pipeline without shifting (e.g., from stage 2*n*). The shift circuitry 232 selectively applies the shift when an addshift signal 240 is asserted. The addshift signal 240 may be asserted when a 1 tCK is to be applied as previously discussed. The shift circuitry 232 may apply stretching of the command based on a BLPlus1 signal 242 that is asserted when the burst length is to be stretched by one cycle. Situations that the blplus1 signal 242 may be asserted to stretch the command for one cycle may include a read command (including non-targeted reads) when a read cyclic redundancy check (CRC) is enabled, offset of rising or falling edges of the on-die termination (RTT), RTT for various combinations of CRC enables, a write command (including non-targeted writes) when CRC is enabled, and/or other command types and parameters. With selective shifting applied or forgone, the shift circuitry 232 outputs a command based at least in part on the addshift signal 240 and/or the BLPlus1 signal 242.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a command interface configured to receive a command from a host device;
   a command shifter configured to receive the command, wherein the command shifter comprises:
      a plurality of stages coupled in series and configured to delay the command, wherein the plurality of stages comprises two pipelines that are each configured to flow at a half-frequency of a frequency of a clock provided by the host device;
      a switch area that is configured to add a single cycle shift to the command by shifting from a first pipeline of the two pipelines to a second pipeline of the two pipelines; and
      selection circuitry configured to receive the command and to select an insertion stage of the plurality of stages for the command, wherein the selection circuitry is configured to select the insertion stage as a location to insert the command to control a duration of delay in the command shifter based at least in part on a path delay between a clock and a data pin of the memory device.

2. The memory device of claim 1, wherein the plurality of stages comprises a plurality of flip-flops.

3. The memory device of claim 2, wherein the plurality of flip-flops are connected to a common clock.

4. The memory device of claim 1, wherein the selection circuitry comprises a demultiplexer configured to select a stage of the plurality of stages based at least in part on the path delay between the clock and the data pin of the memory device.

5. The memory device of claim 1, wherein the duration of delay in the command shifter is based at least in part on a set latency for the memory device.

6. The memory device of claim 5, wherein the duration of delay is based at least in part on the path delay subtracted from the set latency.

7. The memory device of claim 6, wherein the duration of delay is based at least in part on the path delay and a maximum preamble length for the memory device subtracted from the set latency.

8. The memory device of claim 6, wherein the duration of delay is based at least in part on the path delay and a maximum data strobe signal offset for the memory device subtracted from the set latency.

9. The memory device of claim 6, wherein the duration of delay is based at least in part on the path delay and a walk back value for the memory device subtracted from the set latency, wherein the walk back value indicates how much the command is walked back to a faster clock using progressively faster clocks.

10. The memory device of claim 1, wherein the switch area is located at an exit end of the plurality of stages.

11. The memory device of claim 1, a wherein the switch area is located at an exit end of the plurality of stages that is configured to stretch the command for a single cycle by shifting from the first pipeline of the two pipelines to the second pipeline of the two pipelines.

12. A method, comprising:
receiving, at a memory device, an indication of a latency from a host device, wherein the indication of the latency from the host device comprises receiving the indication of the latency via a mode register from the host device;
determining a path delay from clock to DQ pin in the memory device;
receiving, at the memory device, a command from the host device, wherein receiving the command comprises receiving the command in a first pipeline of plurality of flip-flops, wherein the first pipeline and a second pipeline of the plurality of flip-flops are configured to operate at a frequency at half a rate of a clock received from the host device;
determining, using selection circuitry of the memory device, an insertion point in a command shifter having the plurality of flip-flops, wherein the insertion point is a flip-flop of the plurality of flip-flops determined based at least in part on a subtraction of the path delay from the latency;
inserting the command into the insertion point via the selection circuitry; and
shifting the command through a subset of the plurality of flip-flops from the insertion point to an exit point from the plurality of flip-flops, wherein shifting the command comprises shifting the command by an odd number of clock cycles by shifting the command from the first pipeline to the second pipeline.

13. The method of claim 12, wherein the latency comprises a column address strobe latency for the memory device.

14. The method of claim 12, wherein the command comprises a read command when a cyclic redundancy check is enabled, has an offset applied to a rising or falling edge of an on-die termination assertion, or a write command where an cyclic redundancy check is enabled.

15. The method of claim 12, wherein the determining the insertion point is based at least in part on the path delay and a maximum preamble length for the memory device subtracted from the latency.

16. The method of claim 12, wherein the determining the insertion point is based at least in part on the path delay and a maximum data strobe signal offset for the memory device subtracted from the latency.

17. The method of claim 12, wherein the determining the insertion point is based at least in part on the path delay and a walk back value for the memory device subtracted from the latency, wherein the walk back value indicates how much the command is walked back to a faster clock using progressively faster clocks.

18. A method, comprising:
receiving, at a memory device, an indication of a latency from a host device;
determining a path delay from clock to DQ pin of the memory device;
receiving, at the memory device, a command from the host device;
determining, using selection circuitry, an insertion point in a command shifter having a plurality of shifters, wherein the insertion point is based at least in part on a subtraction of the path delay from the latency, wherein determining the insertion point comprises determining that the command is to be shifted or stretched by an odd number of clock cycles;
dynamically inserting the command into an entry point of a first pipeline of the plurality of shifters via the selection circuitry, wherein a location of the entry point in the plurality of shifters is based at least in part on the subtraction of the path delay from the latency; and
outputting the command from the plurality of shifters, wherein outputting the command comprises outputting the command from a second pipeline of the plurality of shifters.

19. The method of claim 18, wherein outputting the command from the second pipeline of the plurality of shifters is based at least in part on a burst length stretch signal or an add shift signal.

20. The method of claim 19, wherein the burst length stretch signal or the add shift signal is based at least in part on a decoding of the command.

21. The method of claim 18, wherein determining the insertion point comprises using a demultiplexer to select a stage of a plurality of stages.

22. The method of claim 18, wherein the determining the insertion point is based at least in part on the path delay and a maximum preamble length for the memory device subtracted from the latency.

23. The method of claim 18, wherein the determining the insertion point is based at least in part on the path delay and a maximum data strobe signal offset for the memory device subtracted from the latency.

24. The method of claim 18, wherein the determining the insertion point is based at least in part on the path delay and a walk back value for the memory device subtracted from the latency, wherein the walk back value indicates how much the command is walked back to a faster clock using progressively faster clocks.

* * * * *